(12) United States Patent
Han

(10) Patent No.: US 9,718,909 B2
(45) Date of Patent: Aug. 1, 2017

(54) POLYMER COMPOUND AND ORGANIC LIGHT-EMITTING DISPLAY DEVICE HAVING THIN-FILM ENCAPSULATION STRUCTURE INCLUDING THE POLYMER COMPOUND

(71) Applicant: Samsung Display Co., Ltd., Yongin (KR)

(72) Inventor: Ouck Han, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 279 days.

(21) Appl. No.: 14/690,176

(22) Filed: Apr. 17, 2015

(65) Prior Publication Data

US 2015/0299358 A1    Oct. 22, 2015

(30) Foreign Application Priority Data

Apr. 18, 2014  (KR) .................. 10-2014-0046933
Apr. 14, 2015  (KR) .................. 10-2015-0052632

(51) Int. Cl.
*H01L 51/54* (2006.01)
*C08F 222/10* (2006.01)
(Continued)

(52) U.S. Cl.
CPC .......... *C08F 222/10* (2013.01); *C08F 220/62* (2013.01); *H01L 51/5253* (2013.01)

(58) Field of Classification Search
None
See application file for complete search history.

(56) References Cited

U.S. PATENT DOCUMENTS 6,762,268 B2 *  7/2004  Shin .................... G03F 7/0395
                                                    526/171
8,087,767 B2    1/2012  Bauer et al.
(Continued)

FOREIGN PATENT DOCUMENTS

JP  09-059488 A  3/1997
JP  10-139865 A  5/1998

*Primary Examiner* — Vu A Nguyen
(74) *Attorney, Agent, or Firm* — Robert E. Bushnell, Esq.

(57) ABSTRACT

A polymer compound has a repeating unit represented by Formula 1 and an organic light-emitting display device including the polymer compound.

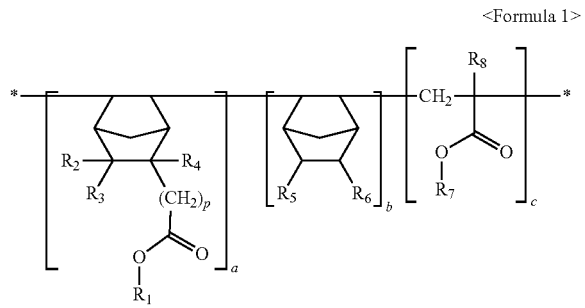

<Formula 1> wherein $R_1$, $R_2$, $R_3$, $R_4$, $R_5$, $R_6$, $R_7$, $R_8$, p, a, b, and c are the same as described in the detailed description section of the present specification.

20 Claims, 2 Drawing Sheets

(51) Int. Cl.
*C08F 220/62* (2006.01)
*H01L 51/52* (2006.01)

(56) References Cited

U.S. PATENT DOCUMENTS

| | | | | |
|---|---|---|---|---|
| 2006/0057490 A1* | 3/2006 | Joo | ..................... | C08F 220/18 430/270.1 |
| 2006/0057494 A1* | 3/2006 | Lee | ..................... | C07D 317/72 430/270.1 |
| 2006/0100403 A1* | 5/2006 | Yoon | ..................... | C08F 220/14 526/218.1 |
| 2007/0172760 A1* | 7/2007 | Choi | ..................... | G03F 7/0397 430/270.1 |
| 2012/0251952 A1* | 10/2012 | Shin | ..................... | C08F 220/18 430/285.1 |
| 2013/0164674 A1* | 6/2013 | Han | ..................... | C08F 220/18 430/270.1 |

* cited by examiner ously used. However, since the acrylate-based material has
an aliphatic structure, it has low physical and chemical
stabilities, and thus, the structure thereof may easily decompose.

POLYMER COMPOUND AND ORGANIC LIGHT-EMITTING DISPLAY DEVICE HAVING THIN-FILM ENCAPSULATION STRUCTURE INCLUDING THE POLYMER COMPOUND

CLAIM PRIORITY

This application makes reference to, incorporates into this specification the entire contents of, and claims all benefits accruing under 35 U.S.C. §119 from an application POLYMER COMPOUND AND ORGANIC LIGHT-EMITTING DISPLAY DEVICE HAVING THIN-FILM ENCAPSULATION STRUCTURE INCLUDING THE POLYMER COMPOUND earlier filed in the Korean Intellectual Property Office on Apr. 18, 2014 and there duly assigned Serial No. 10-2014-0046933, and on Apr. 14, 2015 and there duly assigned Serial No. 10-2015-0052632.

BACKGROUND OF THE INVENTION

Field of the Invention

The present invention relates to a polymer compound and an organic light-emitting display device having a thin-film encapsulation structure including the polymer compound, and in particular, an organic light-emitting display device having a thin-film encapsulation structure including an inorganic layer and an organic layer including the polymer compound.

Description of the Related Art

The encapsulation technology for an organic light-emitting display device includes a substrate binding technology in which an encapsulation substrate is bound to a substrate including an organic light-emitting display device and a thin film encapsulation technology in which an encapsulation film is formed in the form of a thin film without use of an encapsulation substrate. The binding of the encapsulation substrate and the substrate including an organic light-emitting display device may be performed using inorganic frits and an organic binding agent. The thin film encapsulation technology may use an inorganic film formed of, for example, $AlO_x$, $SiN_x$, $SiO_x$, or SiON, on a panel.

An inorganic film for thin-film encapsulation is thin and highly dense, and due to such characteristics, the inorganic film has barrier characteristics against moisture and oxygen. However, the inorganic film is brittle and thus, shows poor mechanical characteristics when stress is applied thereto. In particular, in the manufacturing process of an organic light-emitting display device, numerous particles are placed on a substrate and when an inorganic film is placed on such particles, it is highly affected by stress. Accordingly, barrier characteristics of the inorganic film may decrease.

In response, an organic film is introduced to between the inorganic film and particles to planarize an uneven surface of particles and decrease stress applied to the inorganic film. Herein, the organic film may be formed of an acrylate-based or an epoxy-based material.

In the case of an acrylate-based material, an acrylate backbone is variously substituted with a carbonyl group derivative, and polymers are easily formed by radical polymerization. Accordingly, the acrylate-based material is widely used. However, since the acrylate-based material has an aliphatic structure, it has low physical and chemical stabilities, and thus, the structure thereof may easily decompose.

In the case of an epoxy-based material, various aromatic groups are substituted with an epoxy group. However, the epoxy-based material has a heavy structure and low film formation efficiency. Accordingly, when the epoxy-based material is formed into a film, it is difficult to control a thickness of the film. Also, during a reaction, the epoxy-based material aggressively reacts and it is difficult to control a polymerization rate.

SUMMARY OF THE INVENTION

One or more exemplary embodiments of the present invention may include a polymer compound and an organic light-emitting display device having a thin-film encapsulation structure including the polymer compound that has an easy film-formation control and shows physical and chemical stabilities when stress is applied thereto during processes.

Additional aspects will be set forth in part in the description which follows and, in part, will be apparent from the description, or may be learned by practice of the presented embodiments.

According to one or more exemplary embodiments of the present invention, a polymer compound having a repeating unit represented by Formula 1 may be provided:

<Formula 1>

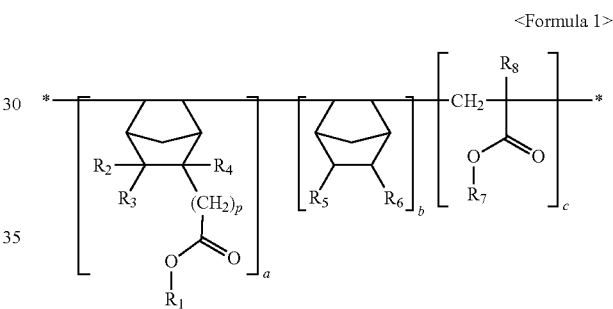

Wherein $R_1$ may be a liner, branched or cyclic $C_1$-$C_{12}$ alkyl group, $R_2$, $R_3$ and $R_4$ may be each independently a hydrogen atom, or a liner or branched $C_1$-$C_6$ alkyl group, $R_5$ and $R_6$ may be each independently a hydrogen atom or a liner or branched $C_1$-$C_{20}$ alkyl group, and may be connected to each other to form a ring, $R_7$ may be a hydrogen atom or a liner, branched or cyclic $C_1$-$C_{12}$ alkyl group or $C_6$-$C_{12}$ aryl group, $R_8$ may be a hydrogen atom or a methyl group, p may be an integer from 0 to 12, and a, b and c may be molar ratios, and may satisfy the condition of a+b+c=1, wherein $0.5 \le a \le 0.9$, $0.05 \le b \le 0.2$, and $0.05 \le c \le 0.3$.

According to one or more exemplary embodiments of the present invention, two or more of the polymer compounds may be cross-linked, sharing any one or each of $R_1$ and $R_7$.

According to one or more exemplary embodiments of the present invention, three or more of the polymer compounds may be cross-linked, sharing $R_7$ that is a branched alkyl group. Herein, from among the cross-linked polymer compounds, two or more polymer compounds may be additionally cross-linked, sharing $R_1$.

According to one or more exemplary embodiments of the present invention, an organic light-emitting display device may include a substrate; an organic light-emitting device on the substrate; and an encapsulation layer on the organic light-emitting device, the encapsulation layer including an inorganic layer and an organic layer which are alternately stacked, wherein the organic layer may include the polymer compound.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings, in which like reference symbols indicate the same or similar components, wherein.

DETAILED DESCRIPTION OF THE INVENTION

Figure 1:
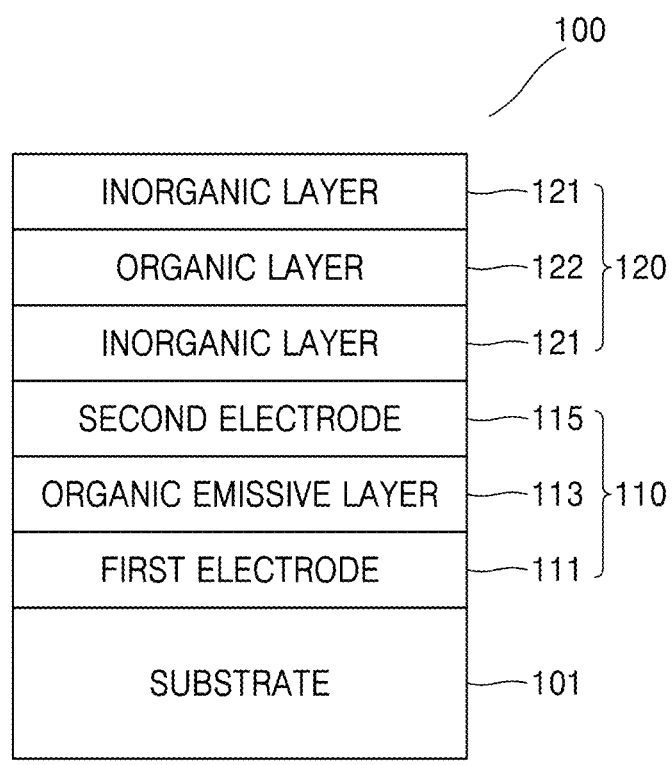
FIG. 1 is a schematic cross-sectional view of an organic light-emitting display device according to an embodiment of the present invention.

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figure, the dimensions of layers and regions may be exaggerated for clarity. Throughout the present specification, like reference numerals indicate like elements.

A polymer compound according to an embodiment of the present invention may include a repeating unit represented by Formula 1:

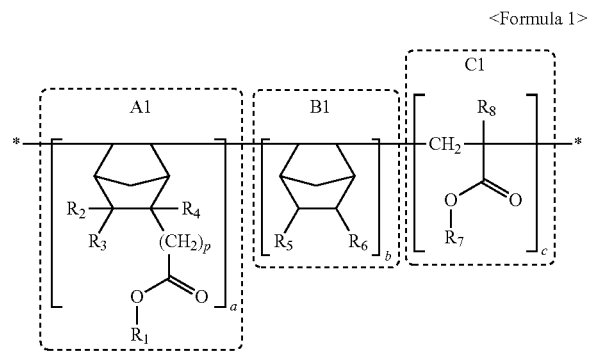

<Formula 1>

The repeating unit represented by Formula 1 may include an A1 moiety, a B1 moiety, and a C1 moiety, and due to the inclusion of the moieties, a hybrid polymer of norbornene and acrylate may be formed.

In the above Formula 1, $R_1$ may be a liner, branched or cyclic $C_1$-$C_{12}$ alkyl group; $R_2$, $R_3$ and $R_4$ may be each independently a hydrogen atom, or a liner or branched $C_1$-$C_6$ alkyl group; $R_5$ and $R_6$ may be each independently a hydrogen atom, or a liner or branched $C_1$-$C_{20}$ alkyl group and may be connected to each other to form a ring; $R_7$ may be a hydrogen atom or a liner, branched or cyclic $C_1$-$C_{12}$ alkyl group or $C_6$-$C_{12}$ aryl group; and $R_8$ may be a hydrogen atom or a methyl group; p may be an integer from 0 to 12; and a, b and c may be molar ratios and may satisfy the condition of a+b+c=1, wherein 0.5≤a≤0.9, 0.05≤b≤0.2, and 0.05≤c≤0.3.

In some embodiments, $R_1$ may be a methyl group, an ethyl group, a propyl group, a butyl group, a pentyl group, a hexyl group, a heptyl group, an octyl group, a nonyl group, a decyl group, a undecyl group, a dodecyl group, a methyl-propyl group, a methyl-butyl group, a dimethyl-propyl group, a dimethyl-butyl group, a methyl-pentyl group, a dimethyl-pentyl group, a trimethyl-butyl group, a methyl-hexyl group, a tetramethyl-butyl group, a dimethyl-hexyl group, an ethyl-hexyl group, a methyl-heptyl group, a trimethyl-pentyl group, a trimethyl-hexyl group, an ethylmethyl-hexyl group, a dimethyl-heptyl group, an ethyl-heptyl group, an ethyldimethyl-hexyl group, a tetramethyl-hexyl group, a diethylmethyl-pentyl group, an ethyltrimethyl-pentyl group, a dimethyl-octyl group, trimethyl-heptyl group, an ethyl-octyl group, a trimethyl-octyl group, an ethylmethyl-octyl group, a methyl-decyl group, a propyl-octyl group, a propyl-nonyl group, an isopropyl-nonyl group, an ethyl-decyl group, a methyl-undecyl group, a dimethyl-decyl group, a dimethyl-propyl-heptyl group, a tetramethyl-octyl group, a cyclopropyl group, a cyclobutyl group, a cyclopentyl group, a cyclohexyl group, or norbornanyl.

In some embodiments, $R_2$, $R_3$ and $R_4$ may be each independently a hydrogen atom, a methyl group, an ethyl group, a propyl group, a butyl group, a pentyl group, a hexyl group, a methyl-propyl group, a methyl-butyl group, a dimethyl-propyl group, an ethyl-propyl group, a dimethyl-butyl group, an ethyl-butyl group, or a methyl-pentyl group.

In some embodiments, $R_5$ and $R_6$ may be each independently a hydrogen atom, a methyl group, an ethyl group, a propyl group, a butyl group, a pentyl group, a hexyl group, a heptyl group, an octyl group, a nonyl group, a decyl group, a methyl-propyl group, a methyl-butyl group, a dimethyl-propyl group, a dimethyl-butyl group, a methyl-pentyl group, a dimethyl-pentyl group, a trimethyl-butyl group, a methyl-hexyl group, a tetramethyl-butyl group, a dimethyl-hexyl group, an ethyl-hexyl group, a methyl-heptyl group, a trimethyl-pentyl group, a trimethyl-hexyl group, an ethylmethyl-hexyl group, a dimethyl-heptyl group, an ethyl-heptyl group, an ethyldimethyl-hexyl group, a tetramethyl-hexyl group, a diethylmethyl-pentyl group, an ethyltrimethyl-pentyl group, a dimethyl-octyl group, a trimethyl-heptyl group, or an ethyl-octyl group.

In some embodiments, $R_7$ may be a methyl group, an ethyl group, a propyl group, a butyl group, a pentyl group, a hexyl group, a heptyl group, an octyl group, a nonyl group, a decyl group, a undecyl group, a dodecyl group, a methyl-propyl group, a methyl-butyl group, a dimethyl-propyl group, a dimethyl-butyl group, a methyl-pentyl group, a dimethyl-pentyl group, a trimethyl-butyl group, a methyl-hexyl group, a tetramethyl-butyl group, a dimethyl-hexyl group, an ethyl-hexyl group, a methyl-heptyl group, a trimethyl-pentyl group, a trimethyl-hexyl group, an ethylmethyl-hexyl group, a dimethyl-heptyl group, an ethyl-heptyl group, an ethyldimethyl-hexyl group, a tetramethyl-hexyl group, a diethylmethyl-pentyl group, an ethyltrimethyl-pentyl group, a dimethyl-octyl group, a trimethyl-heptyl group, an ethyloctyl group, a trimethyl-octyl group, an ethylmethyl-octyl group, a methyl-decyl group, a propyl-octyl group, a propyl-nonyl group, an isopropyl-nonyl group, an ethyl-decyl group, a methyl-undecyl group, a dimethyl-decyl group, a dimethyl-propyl-heptyl group, a tetramethyl-octyl group, a cyclopropyl group, a cyclobutyl group, a cyclopentyl group, a cyclohexyl group, a norbornanyl group, a phenyl group, a naphthyl group, an indenyl group, or a biphenyl group; or a phenyl group, a naphthyl group, an indenyl group, or a biphenyl group, each substituted with a halogen group, a $C_1$-$C_4$ alkyl group, a $C_1$-$C_4$ alkoxy group, or the like.

In some embodiments, two or more of the polymer compounds may be cross-linked, sharing any one or each of $R_1$ and $R_7$. For example, ends of $R_1$ may each link to a carboxylate group connected to norbornene of two polymers to form a cross-linked bond between the two polymers. In some embodiments, independently or additionally with respect to $R_1$, ends of $R_7$ may each link to a carboxylate group of a back bone of two polymers to form a cross-linked bond between the two polymers. For example, two polymers may share a dodecyl group through a carboxylate group connected to norbornene to form a cross-linked bond. In some embodiments, two polymers share a dodecyl group through a carboxylate group of their back bones to form a cross-linked bond. The cross-linked bond may occur, causing a net structure, between two polymers or among a plurality of polymers.

In some embodiments, three or more of the polymer compounds may be cross-linked, sharing $R_7$ that is a branched alkyl group. For example, three polymers may be connected to three ends of a 12-dodecyl-tetracosanyl group through a carboxylate group of their back bones to form a cross-linked bond. The cross-linked bond may occur, causing a net structure, between three polymers or among a plurality of polymers. In some embodiments, from among polymer compounds that are cross-lined through $R_7$, two or more polymer compounds may be additionally cross-linked, sharing $R_1$.

Due to the inclusion of a cross-linked bond, a polymer may have a rigid structure and thus, may enable formation of an organic layer having increased chemical resistance.

In some embodiments, a weight average molecular weight of the polymer compound may be in a range of about 1,000 to about 100,000.

Due to the inclusion of an aliphatic cyclic polymer structure, the polymer compound including the repeating unit represented by Formula 1 may have higher physical and chemical stabilities against plasma or chemical materials during processes, than an aliphatic polymer.

In detail, the repeating unit of the polymer compound may be represented by Formula 2 below:

<Formula 2>

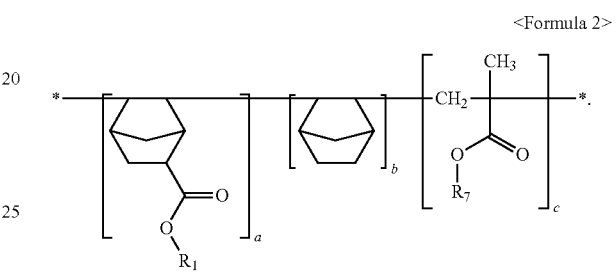

$R_1$ and $R_7$ in Formula 2 are the same as described in connection with $R_1$ and $R_7$ in Formula 1.

In some embodiments, two or more of the polymer compounds having the repeating unit represented by Formula 2 may be cross-linked, sharing any one or each of $R_1$ and $R_7$, as described above.

In some embodiments, three or more of the polymer compounds having the repeating unit represented by Formula 2 may be cross-linked, sharing $R_7$ that is a branched alkyl group. In this regard, from among the polymer compounds that are cross-linked through $R_7$, two or more polymer compounds may be additionally cross-linked, sharing $R_1$.

In some embodiments, the polymer compound having the repeating unit represented by Formula 2 may have a weight average molecular weight of about 1,000 to about 100,000.

For example, the polymer compound may have a repeating unit represented by Formula 3:

<Formula 3>

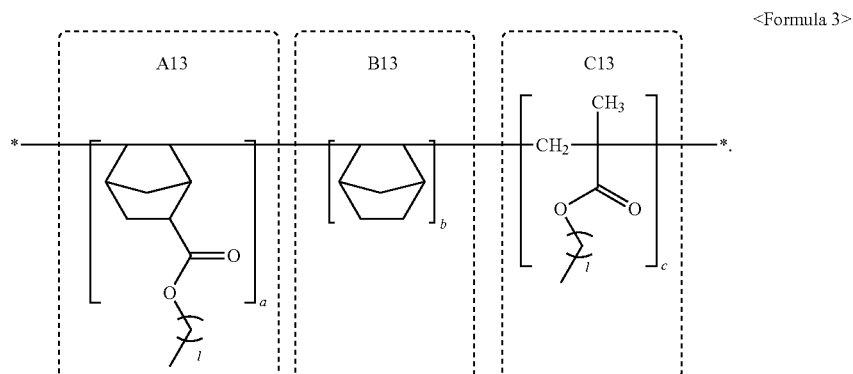

The repeating unit of Formula 3 may have a A13 moiety, a B13 moiety, and a C13 moiety, and due to the inclusion of the moieties, a hybrid polymer of norbornene and acrylate may be formed.

A plurality of I in Formula 3 may be each independently an integer from 1 to 9.

In some embodiments, the polymer compound may have a repeating unit represented by Formula 4:

A plurality of m in Formula 4 may be each independently an integer from 1 to 12, and a plurality of a may each independently have different values, a plurality of b may each independently have different values, and a plurality of c may each independently have different values.

In some embodiments, the polymer compound may entirely or partially have a repeating unit represented by Formula 5:

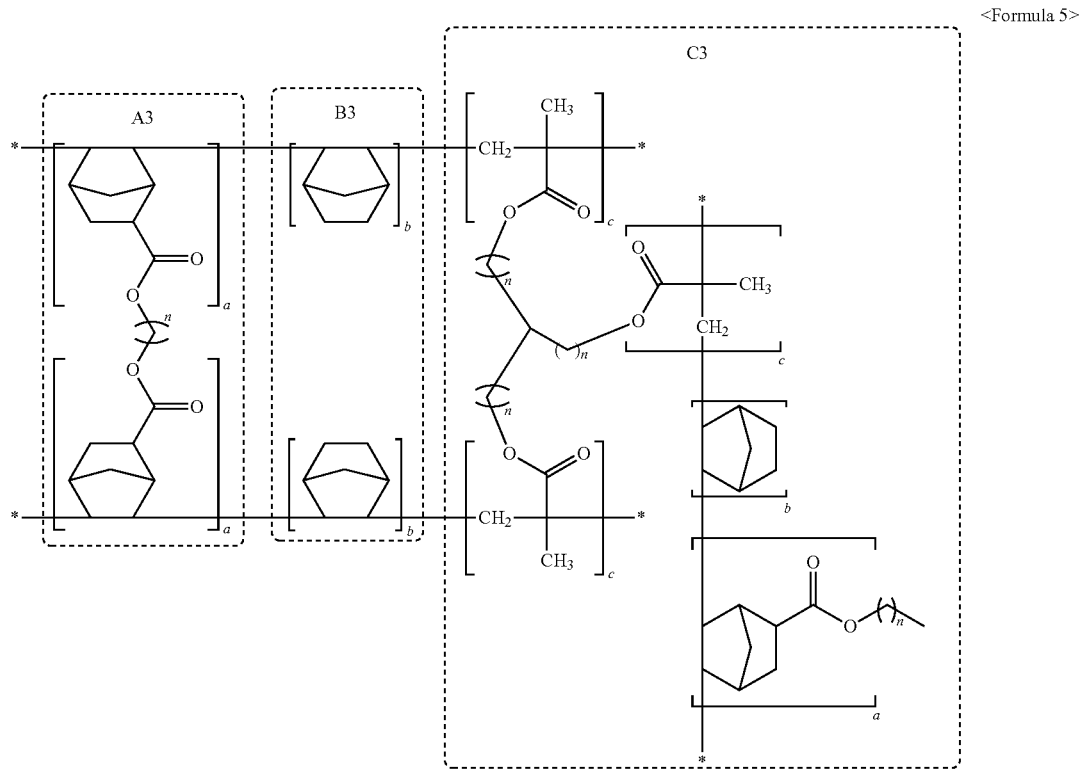

<Formula 5>

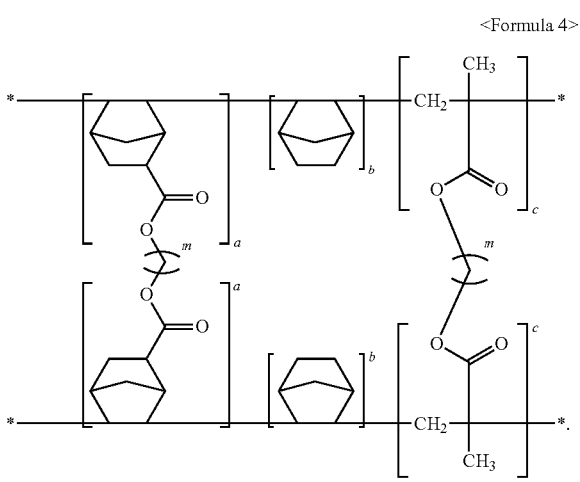

<Formula 4>

The repeating unit of Formula 4 may have an A2 moiety, a B2 moiety, and a C2 moiety, and thus, a hybrid polymer of norbornene and acrylate may be formed. Also, in the presence of a cross-linked bond in the A2 moiety and the C2 moiety, the density and rigidity of the polymer compound may be increased, and thus, the chemical resistance of an organic layer formed by using the polymer compound may be increased.

The repeating unit of Formula 5 may have an A3 moiety, a B3 moiety, and a C3 moiety, and due to the inclusion of these moieties, a hybrid polymer of norbornene and acrylate may be formed.

In some embodiments, in the presence of a cross-linked bond in the A3 moiety and the C3 moiety, the density and rigidity of the polymer compound may be increased, and thus, the chemical resistance of an organic layer formed by using the polymer compound may be increased.

In Formula 5, a plurality of n may be each independently an integer from 1 to 12, and a plurality of a may each independently have different values, a plurality of b may each independently have different values, and a plurality of c may each independently have different values.

a, b, and c in Formulae 3 to 5 may be the same as described in Formula 1, and a plurality of a, b, and c may each independently have different values.

FIG. 1 is a schematic cross-sectional view of an organic light-emitting display device according to an embodiment of the present invention.

Referring to FIG. 1, an organic light-emitting device 110 may be formed on a substrate 101 and an encapsulation layer 120 may be formed on the organic light-emitting device 110.

The organic light-emitting device 110 may include a first electrode 111 and a second electrode 115 and an organic emissive layer 113 formed between the first electrode 111 and the second electrode 115.

In an encapsulation layer 120, the organic layer 122 and the inorganic layer 121 may be alternately stacked. In this regard, the lower most layer of the encapsulation layer 120, that is, a layer of the encapsulation layer 120 that contacts an organic light-emitting device 110, and the upper most layer of the encapsulation layer 120, that is, the outer most layer of the encapsulation layer 120 are the inorganic layer 121.

An organic layer 122 may include the polymer compound represented by Formula 1. The organic layer 122 may relieve a stress to be applied to an inorganic layer 121 and may planarize the inorganic layer 121. A thickness of the organic layer 122 may be determined in consideration of characteristics and productivity of the inorganic layer 121, and device characteristics. For example, the thickness of the organic layer 122 may be in a range of about 1 µm to about 10 µm.

Hereinafter, a method of manufacturing an organic light-emitting display device according to an embodiment of the present invention will be described.

First, a substrate 101 is provided. The substrate 101 may be a glass substrate, a plastic substrate, or a substrate formed of various materials, such as silicon or metal.

A buffer layer (not shown) may be formed on the substrate 101. The buffer layer prevents diffusion of impurity elements or ions from the substrate 101 to a thin film transistor of the organic light-emitting device 110 disposed above the substrate 101 and moisture penetration. Also, the buffer layer may planarize a surface.

In some embodiments, a thin film transistor (not shown) may be formed on the substrate 101, as a circuit for driving the organic light-emitting device 110.

The organic light-emitting device 110 may be formed on the substrate 101. The organic light-emitting device 110 may be electrically connected to the thin film transistor. The organic light-emitting device 110 may include a first electrode 111 and a second electrode 115 and an organic emissive layer 113 formed between the first electrode 111 and the second electrode 115.

The first electrode 111 may be an anode, and in this case, the first electrode 111 may be formed using a material having a high work function that allows holes to be smoothly provided. The first electrode 111 may be a transmissible electrode or a reflective electrode.

The first electrode 111 may be formed by using, for example, indium tin oxide (ITO), indium zinc oxide (IZO), zinc oxide (ZnO), Al-doped zinc oxide (AZO), indium oxide ($In_2O_3$), or tin oxide ($SnO_2$).

In some embodiments, the first electrode 111 may be formed as a reflective electrode by using magnesium (Mg), silver (Ag), aluminium (Al), aluminium:lithium (Al:Li), calcium (Ca), silver:indium tin oxide (Ag:ITO), or magnesium:indium (Mg:In) or magnesium:silver (Mg:Ag).

The first electrode 111 may have a single-layered structure or a multiple-layered structure. The first electrode 111 may be formed by deposition or sputtering.

The organic emissive layer 113 may include at least an emissive layer (EML), and may additionally include at least one layer selected from a hole injection layer (HIL), a hole transport layer (HTL), an electron transport layer (ETL), and an electron injection layer (EIL).

The organic emissive layer 113 may be formed using a low molecular weight material or a polymer, and may be formed by using various methods, such as a vacuum deposition method, a spin coating method, a casting method, or a LB method.

The HIL may be formed by using, for example, a phthalocyanine compound, such as copperphthalocyanine, N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4'4"-tris(N,N-diphenylamino)triphenylamine (TDATA), 4,4',4"-tris{N,-(2-naphthyl)-N-phenylamino}-triphenylamine (2T-NATA), poly(3,4-ethylenedioxythiophene)/poly(4-styrenesulfonate) (PEDOT/PSS), polyaniline/dodecylbenzenesulfonic acid (Pani/DBSA), polyaniline/camphor sulfonicacid (Pani/CSA), or (polyaniline)/poly(4-styrenesulfonate) (PANI/PSS), but other materials may instead be used to form the HIL.

The HTL may be formed by using a carbazole derivative, such as N-phenyla carbazole and polyvinylcarbazole, N,N-bis(3-methylphenyl)-N,N-diphenyl-[1,1-biphenyl]-4,4'-diamine (TPD), N,N-di(1-naphthyl)-N,N-diphenylbenzidine (NPB), or triphenylamine-based material, such as 4,4',4"-tris(N-carbazolyl)triphenylamine) (TCTA), but other materials may instead be used to form the HTL.

The ETL may be formed by using $Alq_a$, 2,9-dimethyl-4, 7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis (2-methyl-8-quinolinolato-N1,O8)-(1,1'-biphenyl-4-olato) aluminum (BAlq), beryllium bis(benzoquinolin-10-olate) ($Bebq_2$), or 9,10-di(naphthalene-2-yl)anthrascene (AND), but other materials may instead be used to form the ETL.

The EIL may be formed by using LiF, NaCl, CsF, Li2O, BaO, Liq, or the like.

The EML may include a host material and a dopant material.

Examples of the host material may be tris(8-quinolinolate)aluminium ($Alq_3$), 4,4'-bis(N-carbazolyl)-1,1'-biphenyl (CBP), poly(n-vinylcabazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl) benzene (TPBI), 3-tert-butyl-9,10-di(naphth-2-yl) anthracene (TBADN), distyrylarylene (DSA), 9,9-diethyl-2-(9,9-diethyl-2-(9,9-diethyl-9H-fluoren-2-yl)-9H-fluoren-7-yl)-9H-fluorene (E3), and 4,4'-bis(9-carbazolyl)-2,2'-dimethyl-biphenyl (CDBP), but are not limited thereto.

Examples of the dopant material may be Pt(II) octaethylporphine (PtOEP), tris(2-phenylisoquinoline)iridium (Ir $(piq)_3$), bis(2-(2'-benzothienyl)-pyridinato-N,C3')iridium (acetylacetonate) ($Btp_2Ir(acac)$), tris(2-phenylpyridine) iridium ($Ir(ppy)_3$), bis(2-phenylpyridine)(Acetylacetonato) iridium(III) ($Ir(mppy)_2(acac)$), tris(2-(4-tolyl)phenylpyridine)iridium ($Ir(mppy)_3$), 10-(2-benzothiazolyl)-1,1,7,7-tetramethyl-2,3,6,7-tetrahydro-1H,5H,11H-[1]benzopyrano [6,7,8-ij]-quinolizin-11-one (C545T), bis[3,5-difluoro-2-(2-pyridyl)phenyl](picolinato)iridium(III) ($F_2Irpic$), $(F_2ppy)_2Ir$ (tmd), $Ir(dfppz)_3$, 4,4'-bis(2,2'-diphenylethen-1-yl)biphenyl (DPVBi), 4,4'-bis[4-(diphenylamino)styryl]biphenyl (DPAVBi), and 2,5,8,11-tetra-tert-butyl perylene (TBPe), but these are not limited thereto.

The second electrode 115 may be a cathode, and in this case, the second electrode 115 may be prepared by using a metal, an alloy, an electrically conductive compound, or a mixture of two or more of these, each of which has a low work function.

The second electrode 115 may be, for example, a transparent electrode or a reflective electrode.

When the second electrode 115 is the transparent electrode, the second electrode 115 may include a thin film formed using lithium (Li), calcium (Ca), aluminium (Al), magnesium (Mg), magnesium-indium (Mg—In), magnesium-silver (Mg—Ag), LiF—Al, LiF—Ca, or a mixture thereof and an auxiliary electrode formed thereon using a transparent conductive material, such as ITO, IZO, ZnO or $In_2O_3$.

In some embodiments, when the second electrode 115 is a reflective electrode, for example, the second electrode 115 may be formed by using lithium (Li), calcium (Ca), aluminium (Al), magnesium (Mg), magnesium-indium (Mg—In), magnesium-silver (Mg—Ag), LiF—Al, LiF—Ca, or a mixture thereof. The second electrode 115 may be formed by sputter or vacuum deposition.

The encapsulation layer 120 may be formed on the organic light-emitting device 110.

The inorganic layer 121 may be formed by using, for example, silicon oxide, silicon nitride, silicon oxynitride, aluminium oxide, aluminium nitride, aluminium oxynitride, titanium oxide, titanium nitride, tantalum oxide, tantalum nitride, hafnium oxide, hafnium nitride, zirconium oxide, zirconium nitride, cerium oxide, cerium nitride, tin oxide, tin nitride, or magnesium oxide.

An optimal thickness of the inorganic layer 121 may be determined in consideration of productivity or device characteristics. For example, the inorganic layer 121 may have a thickness of about 500 nm to about 10 p.m. The inorganic layer 121 may be formed by chemical vapor deposition (CVD), plasma-enhanced chemical vapor deposition (PECVD), sputter, atomic layer deposition (ALD), or thermal evaporation.

The organic layer 122 may be formed on the inorganic layer 121. The organic layer 122 may be formed by using a polymer compound having a repeating unit represented by one of Formulae 1 to 5. The organic layer 122 formed of the polymer compounds having the repeating units of Formulae 1 to 5 may be formed by, for example, mixing, flash evaporation, or UV curing-induced radical polymerization of corresponding monomers. However, other methods may instead be used to form the organic layer 122. A mixture of monomers may be coated and polymerized on a substrate to form a polymer organic layer by flash evaporation and UV-curing.

A thickness of the organic layer 122 may be determined in consideration of characteristics of the inorganic layer 121, productivity, and device characteristics. For example, the thickness of the organic layer 122 may be in a range of about 1 μm to about 10 μm.

The polymer compound having the repeating unit represented by Formula 1 may also be used in thin-film encapsulating for other electron devices than an organic light-emitting device film. In some embodiments, the polymer compound having the repeating unit represented by Formula 1 may be used to planarize a metal layer of an electronic device and particles generated during manufacturing an electronic device.

Synthesis Methods

Synthesis of a Polymer Compound Having Repeating Unit Represented by Formula 1

The polymer compound having the repeating unit of Formula 1 may be formed by radical polymerization of monomers illustrated in the following Reaction Scheme 1. Referring to the following Reaction Scheme 1, ultraviolet (UV) rays are irradiated to a mixture including Monomer A1', Monomer B1', and Monomer C1', respectively corresponding to the A1 moiety, the B1 moiety, and the C1 moiety in Formula 1, and an initiator to form a radical, and the formed radical consecutively causes a radical polymerization to synthesize the polymer compound having a repeating unit represented by Formula 1. In this regard, a molar ratio of A1', B1' and C1' may be controlled in consideration a ratio of a, b, and c in Formula 1. The initiator may be selected from initiators that are suitable for the radical polymerization.

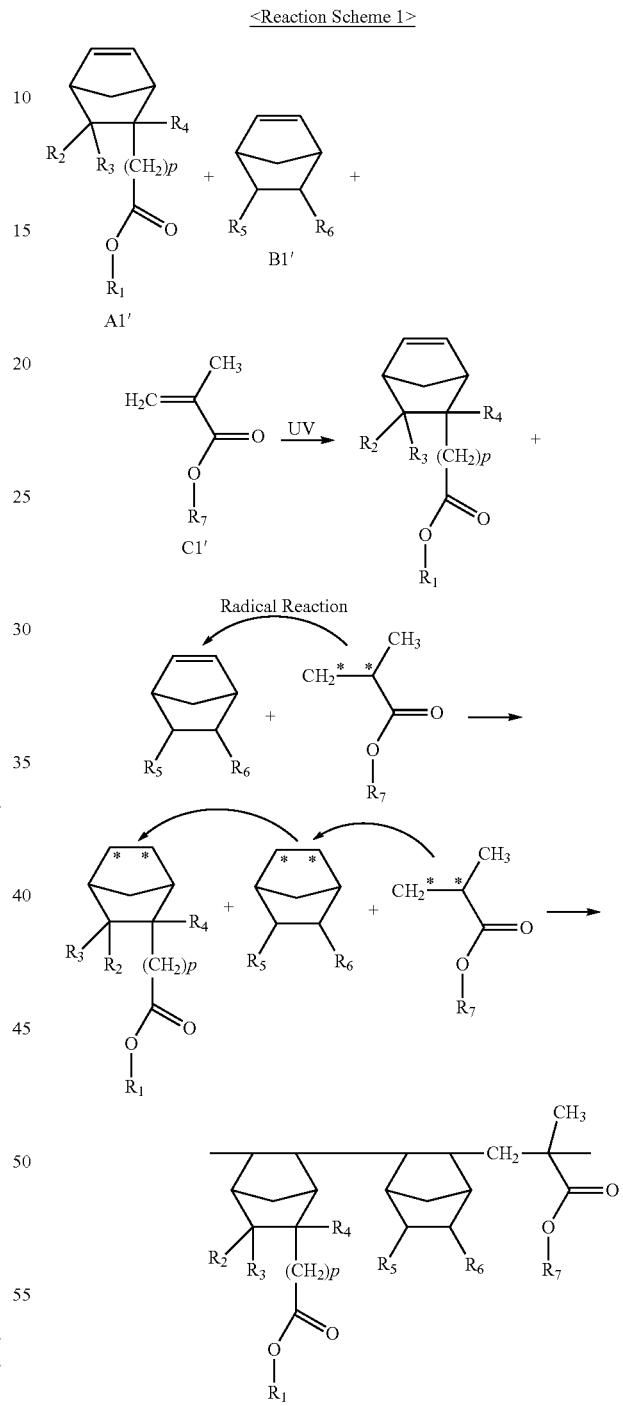

<Reaction Scheme 1>

In the reaction scheme 1, $R_1$ to $R_7$ may be the same as described in connection with $R_1$ to $R_7$ in Formula 1.

Synthesis of a Polymer Compound Having Repeating Unit Represented by Formula 3

Monomer A13' corresponding to A13 in Formula 3 may be synthesized according to Reaction Scheme 2:

<Reaction Scheme 2>

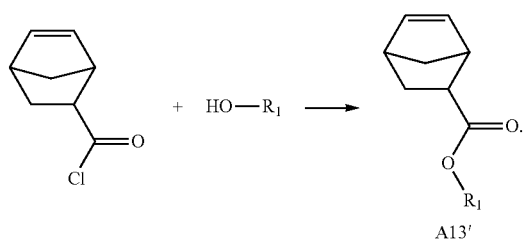

Monomer C13' corresponding to C13 in Formula 3 may be synthesized according to Reaction Scheme 3:

<Reaction Scheme 3>

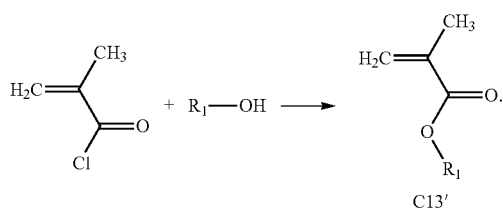

The polymer compound having the repeating unit of Formula 3 was synthesized in the same manner as used to synthesize the polymer compound having the repeating unit of Formula 1, except that A13' and C13' were respectively used instead of A1' and C1', and B1' in which $R_5$ and $R_6$ are each a hydrogen was used in Reaction Scheme 1. In regard to Reaction Scheme 2 and Reaction Scheme 3, when $R_1$ is —$(CH_2)_1$—$CH_3$, A13' and C13' respectively correspond to A13 and C13 in Formula 3. In this regard, a molar ratio of A13', B1', and C13' may be determined depending on a ratio of a, b, and c in Formula 3.

Synthesis of a Polymer Compound Having Repeating Unit Represented by Formula 4

Monomer A2' corresponding to A2 in Formula 4 may be synthesized according to Reaction Scheme 4:

<Reaction Scheme 4>

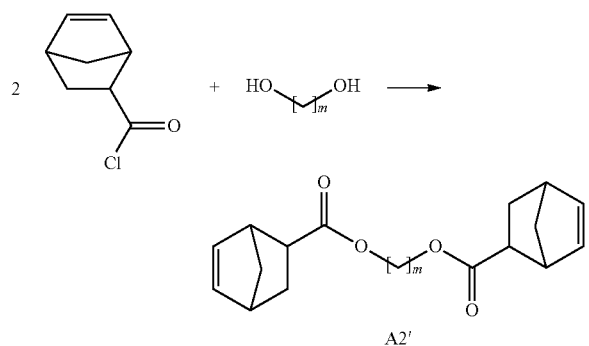

Monomer C2' corresponding to C2 in Formula 4 may be synthesized according to Reaction Scheme 5:

<Reaction Scheme 5>

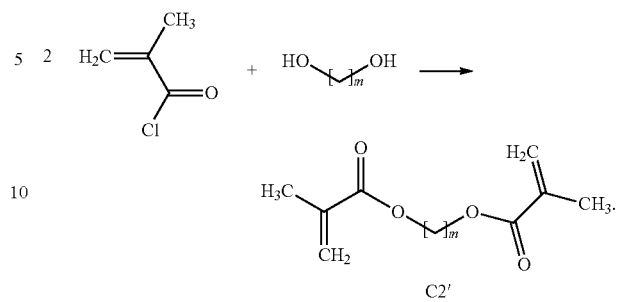

The polymer compound having the repeating unit of Formula 4 was synthesized in the same manner as used synthesize the polymer compound having the repeating unit of Formula 1, except that A2' and C2' were respectively used instead of A1' and C1', and B1' in which $R_5$ and $R_6$ are each a hydrogen was used in Reaction Scheme 1. In this regard, a molar ratio of A2', B1' and C2' may be determined depending on a ratio of a, b, and c in Formula 4.

m in Reaction Scheme 4 and Reaction Scheme 5 may be an integer from 1 to 12.

Synthesis of a Polymer Compound Having Repeating Unit Represented by Formula 5

Monomer C3' corresponding to C3 in Formula 5 may be synthesized according to Reaction Scheme 5:

<Reaction Scheme 5>

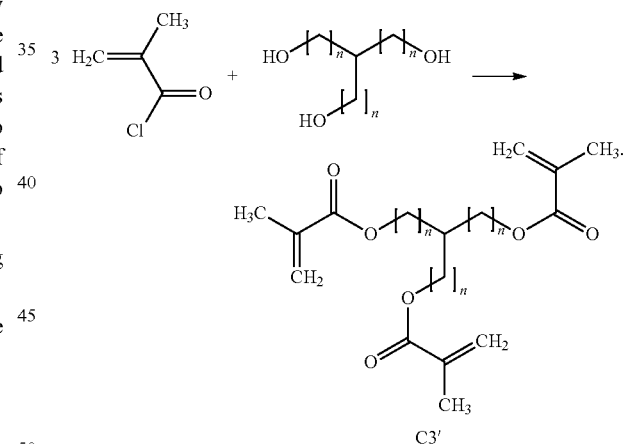

The polymer compound having the repeating unit of Formula 5 was synthesized in the same manner as used to synthesize the polymer compound having the repeating unit of Formula 1, except that A2' and C3' were respectively used instead of A1' and C1', and B1' in which $R_5$ and $R_6$ are each a hydrogen was used in Reaction Scheme 1. In this regard, a molar ratio of A2', B1', and C3' may be determined depending on a ratio of a, b, and c in a, b, and c in Formula 5. n in Reaction Scheme 5 may be an integer from 1 to 12.

EXAMPLE

A 15 Ω/cm² (1,200 Å) ITO glass substrate manufactured by Corning, Inc. was sonicated by using isopropyl alcohol and pure water, each for 5 minutes, and then, by exposure to ultraviolet rays and ozone for 30 minutes to form an anode on a substrate. An organic light-emitting device having a stacked structure including a hole transport layer, an emissive layer, an electron transport layer, and a cathode was formed on the ITO glass substrate. Aluminium oxide was vacuum deposited on the organic light-emitting device to form an inorganic layer having a thickness of 10,000 Å. A mixture including Monomer AT (m=12), Monomer C3' (n=12), Monomer B1'($R_5$ and $R_6$ are each a hydrogen), and an initiator was deposited on the inorganic layer by flash evaporation and UV curing of the monomers to form an organic layer that had a thickness of 20,000 Å and was formed of the polymer compound (weight average molecular weight (Mw) is 7,000) having the repeating unit of Formula 5. In this regard, a molar ratio of Monomer A2': Monomer B1':Monomer C3' in the mixture was 7:2:1.

Silicon nitride was vacuum deposited on the organic layer to form an inorganic layer having a thickness of 10,000 Å to form an organic light-emitting display device.

COMPARATIVE EXAMPLE

An organic light-emitting display device was manufactured in the same manner as in Example, except that the organic layer was formed by using polyacrylate instead of the polymer compound having the repeating unit of Formula 5.

Test

Figure 2:
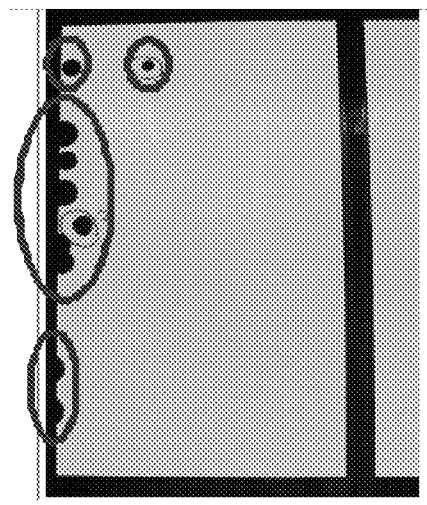
FIG. 2 is an optical microscopic image of an organic light-emitting display device manufactured according to Comparative Example, 240 hours after driving according to an embodiment of the present invention.
Figure 3:
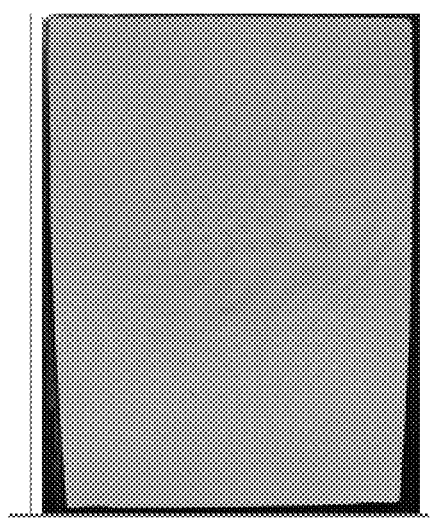
FIG. 3 is an optical microscopic image of an organic light-emitting display device manufactured according to Example, 240 hours after driving according to an embodiment of the present invention.

The organic light-emitting display devices manufactured according to the Example and the Comparative Example were driven at a temperature of 85° C. in a humidity of 90% and formation of black spots were monitored every 48 hour. FIG. 2 and FIG. 3 are optical microscopic images of an organic light-emitting display device manufactured according to Example and Comparative Example, respectively, 240 hours after driving. As shown in FIG. 2, a plurality of black spots appeared on the organic light-emitting display device manufactured according to Comparative Example, 240 hours after the driving. However, as shown in FIG. 3, a black spot did not appear on the organic light-emitting display device manufactured according to Example, even after the 240 hours of driving.

Acrylate, which is used in an organic layer of the related art, may be damaged by plasma during an inorganic layer is formed. For example, as illustrated in the following scheme, thermal decomposition may occur, generating gas, which causes progressive black spots over time as shown in FIG. 2.

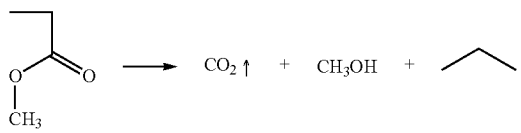

However, in the case of the polymer compound having the repeating unit of Formula 5, due to the cyclic structure of norbornene structure and a cross-linked bond, thermal decomposition during processes may be suppressed and thus, formation of progressive black spots may be prevented as shown in FIG. 3.

An organic light-emitting display device according to embodiments of the present invention may have a thin-film encapsulation structure that has an easy control of a film formation characteristics, stabilities against physical and chemical influences applied thereto during processes, and improved barrier characteristics against moisture and external gas.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:
1. A polymer compound having a repeating unit represented by Formula 1:

<Formula 1>

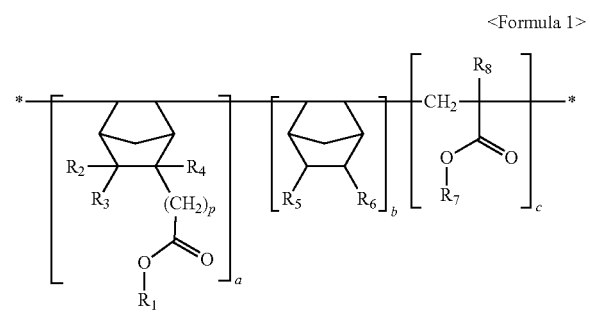

wherein in Formula 1,
$R_1$ is a liner, branched, or cyclic $C_1$-$C_{12}$ alkyl group,
$R_2$, $R_3$, and $R_4$ are each independently a hydrogen atom or a linear or branched $C_1$-$C_6$ alkyl group,
$R_5$ and $R_6$ are each independently a hydrogen atom or a linear or branched $C_1$-$C_{20}$ alkyl group,
$R_7$ is a hydrogen atom or a linear, branched or cyclic $C_1$-$C_{12}$ alkyl group or $C_6$-$C_{12}$ aryl group,
$R_8$ is a hydrogen atom or a methyl group, and
p is an integer from 0 to 12, and a, b and c are each a molar ratio, and satisfy the condition of a+b+c=1, wherein 0.5≤a≤0.9, 0.05≤b≤0.2, and 0.05≤c≤0.3.

2. The polymer compound of claim 1, wherein
two or more of the polymer compounds are cross-linked, sharing any one or each of $R_1$ and $R_7$.

3. The polymer compound of claim 1, wherein
three or more of the polymer compounds are cross-linked, sharing $R_7$ that is a branched alkyl group.

4. The polymer compound of claim 3, wherein
from among the polymer compounds that are cross-linked, two or more polymer compounds are additionally cross-linked, sharing $R_1$.

5. The polymer compound of claim 1, wherein
the polymer compound has a weight average molecular weight of about 1,000 to about 100,000.

6. The polymer compound of claim 1, wherein
the repeating unit is represented by Formula 2:

<Formula 2>

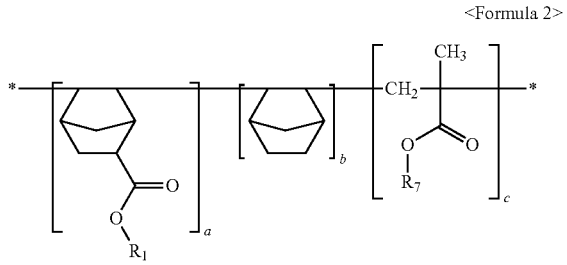

wherein $R_1$ and $R_7$ are each independently a linear or branched $C_1$-$C_{12}$ alkyl group.

7. The polymer compound of claim 6, wherein
two or more of the polymer compounds are cross-linked, sharing any one or each of $R_1$ and $R_7$.

8. The polymer compound of claim 6, wherein
three or more of the polymer compounds are cross-linked, sharing $R_7$ that is a branched alkyl group.

9. The polymer compound of claim 8, wherein
from among the polymer compounds that are cross-linked, two or more polymer compounds are additionally cross-linked, sharing $R_1$.

10. The polymer compound of claim 6, wherein
the polymer compound has a weight average molecular weight of about 1,000 to about 100,000.

11. The polymer compound of claim 1, wherein
the repeating unit is represented by Formula 3:

<Formula 3>

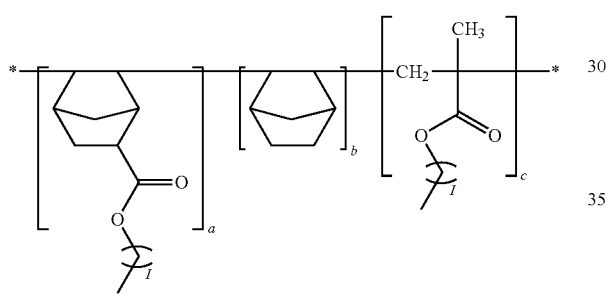

wherein a plurality of l are each independently an integer from 1 to 9.

12. The polymer compound of claim 2, wherein
the repeating unit is represented by Formula 4:

<Formula 4>

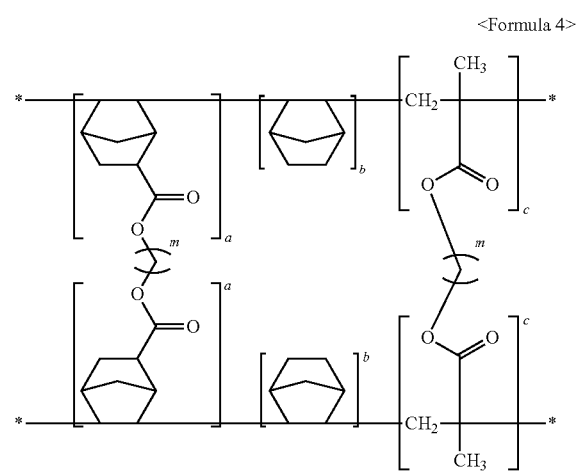

wherein, a plurality of m are each independently an integer from 1 to 12.

13. The polymer compound of claim 4, wherein
the repeating unit is partially or entirely represented by Formula 5:

<Formula 5>

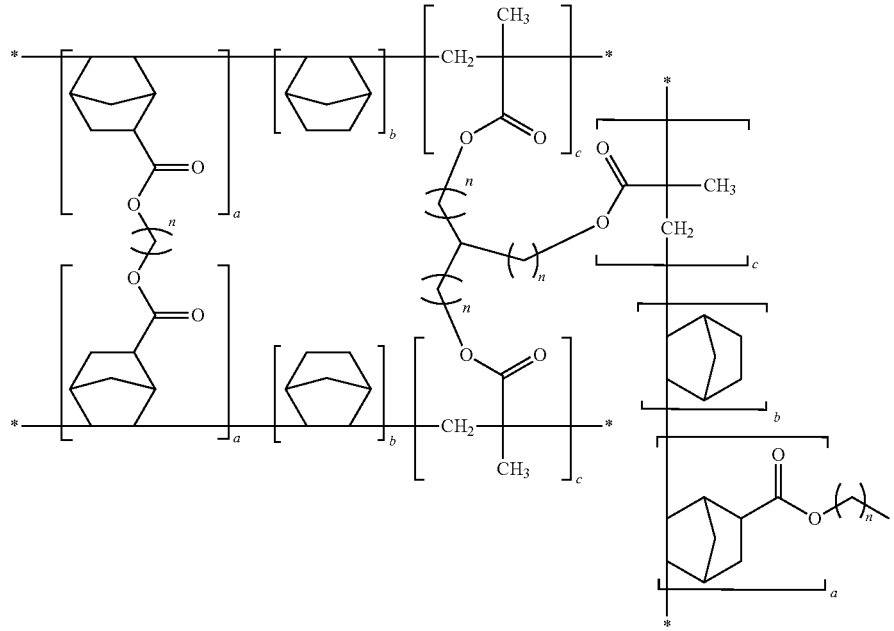

in which a plurality of n are each independently an integer from 1 to 12.

14. An organic light-emitting display device, comprising a substrate;
an organic light-emitting device on the substrate; and
an encapsulation layer on the organic light-emitting device, the encapsulation layer comprising an inorganic layer and an organic layer which are alternately stacked, wherein
the organic layer comprises the polymer compound as claimed in claim 1.

15. The organic light-emitting display device of claim 14, wherein the encapsulation layer comprises a lower most layer and an upper most layer, which are each an inorganic layer.

16. The organic light-emitting display device of claim 14, wherein the inorganic layer has a thickness of about 500 nm to about 10 μm.

17. The organic light-emitting display device of claim 14, wherein the organic layer has a thickness of about 1 μm to about 10 μm.

18. The organic light-emitting display device of claim 14, wherein the inorganic layer comprises at least one selected from silicon oxide, silicon nitride, silicon oxynitride, aluminium oxynitride, magnesium oxide, aluminium oxide, aluminium nitride, titanium oxide, titanium nitride, tantalum oxide, tantalum nitride, hafnium oxide, hafnium nitride, zirconium oxide, zirconium nitride, cerium oxide, cerium nitride, tin oxide, and tin nitride.

19. The organic light-emitting display device of claim 14, wherein the organic light-emitting device comprises a first electrode, a second electrode, and an organic emissive layer between the first electrode and the second electrode.

20. The organic light-emitting display device of claim 19, wherein the organic light-emitting device further comprises at least one layer selected from a hole injection layer, a hole transport layer, an electron injection layer, and an electron transport layer, wherein the at least one layer is between the first electrode and the second electrode.

* * * * *